United States Patent [19]

Usui et al.

[11] Patent Number: 5,162,254
[45] Date of Patent: Nov. 10, 1992

[54] SEMICONDUCTOR DEVICE HAVING A SOI SUBSTRATE AND FABRICATION METHOD THEREOF

[75] Inventors: Shouji Usui, Tokyo; Taketoshi Inagaki, Kawasaki; Kiyomasa Kamei, Tokyo; Takeshi Matsutani, Machida; Kazunori Imaoka, Komae, all of Japan

[73] Assignee: Fujitsu Limited, Kawasaki, Japan

[21] Appl. No.: 606,956

[22] Filed: Oct. 31, 1990

[30] Foreign Application Priority Data

Oct. 31, 1989 [JP] Japan ................................ 1-283514

[51] Int. Cl.$^5$ ........................................ H01L 21/304
[52] U.S. Cl. ............................... 437/63; 437/21; 437/925; 437/974; 148/DIG. 135
[58] Field of Search ............... 437/21, 62, 63, 925, 437/966, 974; 148/DIG. 12, DIG. 135, DIG. 150; 357/23.7

[56] References Cited

U.S. PATENT DOCUMENTS

| 4,575,925 | 3/1986 | Kanbara et al. | 437/21 |
| 4,933,298 | 6/1990 | Hasegawa | 437/62 |
| 4,983,251 | 1/1991 | Haisma et al. | 437/974 |

FOREIGN PATENT DOCUMENTS

| 0059852 | 3/1986 | Japan | 437/62 |
| 0012543 | 1/1989 | Japan | 148/DIG. 12 |

OTHER PUBLICATIONS

J. B. Lasky, S. R. Stiffler, F. R. White, J. R. Abernathey; Bonding and Etch-Back; Silicon-On-Insulator (SOI); pp. 684–687; IEDM 1985.

Primary Examiner—Brian E. Hearn
Assistant Examiner—C. Chaudhari
Attorney, Agent, or Firm—Staas & Halsey

[57] ABSTRACT

A method for producing a semiconductor device on a semiconductor layer provided on an insulator layer comprises the steps of providing an opening on the semiconductor layer to expose a top surface of the insulator layer, depositing a first material layer that has a hardness exceeding the hardness of the semiconductor layer on the semiconductor layer including the exposed top surface, and patterning the first material layer such that a patterned region of the first inorganic material is left in the opening with a gap separating the patterned region from the side wall of the semiconductor layer. The method also comprises the steps of depositing a second material layer of a second inorganic material having a hardness substantially equal to the hardness of the semiconductor layer such that the second material layer covers the semiconductor layer including the opening wherein the patterned region of the first inorganic material is formed, said second material layer being deposited such that the second material layer covers the side wall of the opening and fills the gap between the side wall of the patterned region and the side wall of the opening, and lapping a top surface of the semiconductor layer that is covered by the second material layer, starting from a top surface of the second material layer and proceeding toward the insulator layer until a top surface of the patterned region of the first inorganic material is exposed.

13 Claims, 12 Drawing Sheets

SEMICONDUCTOR DEVICE HAVING A SOI SUBSTRATE AND FABRICATION METHOD THEREOF

BACKGROUND OF THE INVENTION

1. Field of the Invention

The present invention generally relates to semiconductor devices, and in particular to the fabrication of a semiconductor device including a process of lapping a semiconductor layer to a desired layer thickness with high precision, including excellent control of the flatness and uniformity of the semiconductor layer. The present invention is particularly useful when applied to fabrication of semiconductor devices having the so-called SOI (silicon-on-insulator) substrate. However, the present invention is by no means limited to such particular semiconductor devices.

2. Description of the Related Art

SOI substrates are known as an effective structure for providing a nearly ideal device isolation in integrated circuits. In SOI substrates, a semiconductor layer is provided on an insulator layer that may be a mechanically rigid insulator plate or provided on an insulator layer that is provided on another, mechanically rigid semiconductor substrate. Semiconductor devices are formed on the semiconductor layer on the insulator layer. By segmenting the semiconductor layer in correspondence to the semiconductor devices, various preferable features such as increased breakdown voltage, elimination of latch-up in complementary metal-oxide-silicon (CMOS) devices, reduction of the so-called soft errors and the like, can be achieved. Particularly, when the layer thickness of the semiconductor layer on which the semiconductor devices are formed is reduced, the parasitic capacitance associated with the semiconductor layer is decreased, and thereby one can obtain an increased operational speed of the semiconductor device.

There are several different processes to produce the SOI substrate. For example, there is a so-called SIMOX process, wherein oxygen atoms are implanted into a silicon substrate at a controlled depth from the surface such that there is formed an insulator layer of oxide underlying a silicon layer that, in turn, is used as an active semiconductor layer in which active devices are formed. Further, there is known a process including steps of depositing a polysilicon layer on an insulator substrate such as silicon oxide and subsequently crystallizing the polysilicon layer by annealing. However, any of these processes has the problem in that the quality of the semiconductor layer obtained on the insulator layer is not satisfactory.

There is a third process known for producing the SOI substrate, wherein a single crystal semiconductor layer, having an oxide layer on the surface, is bonded with another single crystal semiconductor layer that also has the surface formed with an oxide layer. The bonding is made by intimately contacting the side of both semiconductor layers on which the oxide layer is formed with each other such that there is formed an intervening oxide layer between the pair of semiconductor layers. Further, a heat treatment is applied such that there is formed a polymerization of signal bonds at the contacting oxide layers. With this process, the semiconductor layer for use as a part of the active device has the quality that is equivalent to that of the bulk semiconductor layer and an excellent device characteristic is guaranteed.

In the SOI substrate produced by the last mentioned process, the semiconductor layer is lapped subsequently to a desired layer thickness. For example, the layer thickness of the semiconductor layer is reduced from about 600–700 μm to about several microns by lapping. Recently, there is a demand to reduce the layer thickness further to 0.1–5 μm such that the operational speed of the semiconductor device is further improved. As already noted, the operational speed of the semiconductor device is improved by reducing the layer thickness of the active semiconductor layer as a result of the decreased parasitic capacitance.

When the lapping process is applied to the SOI substrate to reduce the thickness of the semiconductor layer to such an extent, however, there arises a case in which the lapping may proceed inhomogeneously or somewhat obliquely. When this occurs particularly in a wafer having a large diameter, a part of the semiconductor layer may be totally removed or the layer thickness of the semiconductor layer may become inhomogeneous.

In order to avoid the problem, it has been practiced to provide a so-called stopper or lapping stopper of a material that resists the mechanical lapping on a suitable location of the surface of the semiconductor layer such that the lapping proceeds uniformly over the entire surface of the semiconductor layer. For example, the stopper may be provided in correspondence to the dicing line of the semiconductor wafer.

FIGS. 1A and 1B show the conventional process of lapping the SOI substrate using the lapping stopper.

Referring to FIG. 1A, the SOI substrate comprises a single crystal silicon layer 31 acting as the foundation of the SOI structure. On the silicon layer 31, a silicon oxide layer 32 is formed and another single crystal silicon layer 33 is provided on the silicon oxide layer 32. As already explained, the substrate 31 and the silicon layer 33 are bonded with the intervening silicon oxide layer 32.

On the silicon oxide layer 32, there is provided a groove 34 in correspondence to the dicing line such that the silicon oxide layer 32 is exposed at the groove 36. Further, there is provided a lapping stopper 35 of a material like silicon oxide or other hard material that resists lapping, on the silicon oxide layer 32 in correspondence to the groove 34. Because of the possible deviation from the ideal alignment, the lapping stopper 35 cannot be provided to fill the groove 34 completely but is made to be smaller in width as compared with the width of the groove 34. Thereby, it should be noted that there is formed a gap 36 in the groove 34 generally at both sides of the lapping stopper 35.

The structure of FIG. 21A may be produced by bonding the silicon layer 31 and the silicon layer 33 as already described and subsequently grinding the silicon layer 33 to a thickness of about several microns. The initial thickness of the silicon layer 33 may be several hundred microns. Next, the groove 34 is formed by applying the reactive in etching (RIE) process such that the semiconductor layer 33 is selectively removed in correspondence to the groove 34. The etching is continued until the silicon oxide layer 32 is exposed. Next, a silicon layer not illustrated is deposited on the entire surface of the SOI substrate by a CVD process to a predetermined thickness and subsequently patterned, for example by the RIE process. The patterning is conducted such that the lapping stopper 35 is left in the groove 34 with the gaps 36 formed at both sides of the lapping stopper 35. As already explained, the gap 36 is provided to avoid the possible misalignments at the time of patterning, and thereby it is guaranteed that no silicon oxide is remained on the surface of the silicon oxide layer 33.

Next, the structure of FIG. 1A is subjected to the mechanical lapping. Thereby, the thickness of the semiconductor layer 33 is reduced until the top surface of the layer 33 becomes flush with the top surface of the lapping stopper 35 as shown in FIG. 1B. Once the state of FIG. 1B is achieved, further decrease in the thickness of the layer 33 by etching is resisted by the lapping stopper 35 that is characterized by an increased hardness or decreased lapping rate as compared with silicon.

In this conventional approach, there exists an obvious problem in that a gently declining surface 37 tends to develop in the semiconductor layer 33 at both sides of the lapping stopper 35. With the existence of the declining surface 37, the semiconductor layer 33 gradually reduces the thickness toward the lapping stopper 35. This is because the existence of the gap 36 facilitates the lapping at the edge part of the groove 34 and thereby the edge part of the groove 34 is preferentially removed. This region having the declining surface 37 has a lateral extension x that may reach as much as several hundred microns. Obviously, such reduction in the thickness of the semiconductor layer 33 near the groove 34 causes a change in the depth of the diffusion regions formed in the layer 33, and thereby there is a substantial risk that the characteristic of the semiconductor device is changed in the region near the groove 34. As the lateral extension x of the region that has the declining surface 37 is in the order of several hundred microns, the effect of such a decrease in the thickness of the semiconductor layer 33 on the device characteristic is by no means negligible. Conventionally, the extension x cannot be decreased below about 100 $\mu$m even when one uses a hard cloth for the lapping.

FIGS. 2A-2C show another conventional example of the lapping stopper that is disclosed in the Japanese Laid-open Patent Application No. 1-136328. As the process for forming the structure including the silicon substrate 31 and the silicon layer 33 with the intervening silicon oxide layer 32 and the groove 34 is identical with the step of forming the structure of FIG. 1A, the description for this part will be omitted.

According to this approach, a silicon oxide layer 35a is deposited by the CVD process with a uniform thickness on the semiconductor layer 33 including the groove 34. In correspondence to the groove 34, there is formed a depression 41 on the surface of the silicon oxide layer 35a. This depression 41 is subsequently filled by a photoresist 42, and using the photoresist 42 as a mask, the silicon oxide layer 35a is subjected to the RIE process. Thereby, the RIE process is controlled such that the etching is stopped when the silicon oxide layer 35a filling the gap 36 has a top surface that is exactly flush with the surface of the silicon oxide layer embedded underneath the photoresist 42. In other words, a silicon oxide layer that has a flat upper surface is obtained in the groove 34 as the lapping stopper 35 as shown in FIG. 2B.

Next, the photoresist 42 is removed and the structure thus obtained is subjected to a lapping process until the top surface of the semiconductor layer 33 becomes flush with the top surface of the lapping stopper 35 as shown in FIG. 2C. In this process, it is possible to obtain a completely flat upper surface of the semiconductor layer 33. In other words, the undesirable gap 36 of the previous example is eliminated from this structure and the formation of the declining surface 37 near the groove 34 is eliminated.

It should be noted that this approach relies upon the exact control of the RIE process to obtain the flat upper major surface of the lapping stopper 35. In other words, the RIE process has to be controlled in an extremely exact manner such that there is no insufficient etching or excessive etching of the silicon oxide layer 35a. When the etching is insufficient, a structure shown in FIG. 3A is obtained wherein there is formed a depression 35b surrounded by side walls 35c of increased height or thickness. Such a side wall 35c of silicon oxide is mechanically fragile and may come off upon further lapping When this occurs, such silicon oxide debris inevitably causes scars on the surface of the thin silicon layer 33. Such scars would be detrimental to the device characteristic of the semiconductor device formed on the silicon layer 33. On the other hand, when the etching is performed excessively, a structure shown in FIG. 3B is obtained wherein there is formed the gap 36 as a result of the excessive etching of silicon oxide. This structure is identical with the structure of the example described with reference to FIGS. 1A-1C, and because of this, the structure has the same problem of the declining surface 37 being formed near the groove 34.

SUMMARY OF THE INVENTION

Accordingly, it is a general object of the present invention to provide a novel and useful fabrication process, wherein the aforementioned problems are eliminated.

Another object of the present invention is to provide a process for producing a semiconductor device including a step of forming a semiconductor layer with a controlled thickness by lapping, wherein the semiconductor layer has an excellent planar surface at the surface that is subjected to the lapping process.

Another object of the present invention is to provide a process for producing a semiconductor device including a step of lapping a semiconductor layer with an exactly controlled thickness, said step of lapping being carried out by using a lapping stopper that is provided in a grooved region in the semiconductor layer, wherein the lapping stopper comprises a layer of material having an increased hardness as compared to the semiconductor layer and wherein any gap formed between the lapping stopper and the side wall of the groove is filled by an inorganic material that does not cause contamination of the semiconductor device even when subjected to the lapping process.

Another object of the present invention is to provide a process for producing a semiconductor device on a substrate, said substrate comprising an insulator layer and a semiconductor layer provided on the insulator layer, wherein the process comprises a step of forming a groove in the semiconductor layer, depositing a first inorganic material layer having a hardness that exceeds the hardness of the semiconductor layer on the semiconductor layer including the groove, patterning the first inorganic material layer to form a lapping stopper such that the lapping stopper is formed in the groove with a gap that separates the lapping stopper from the side wall of the groove, depositing a second inorganic material layer on the semiconductor layer including the groove such that the separation is filled by the second inorganic material layer, and lapping the second inorganic material layer and the semiconductor layer until the surface of the lapping stopper is exposed.

According to the present invention, the problem that the semiconductor layer has a thinned out edge at the groove as a result of the lapping is positively prevented by filling the gap by the second inorganic material layer. By choosing the material of the second inorganic material layer such that the debris of the second inorganic material formed as a result of the lapping do not cause contamination of the semiconductor layer, the removal of the second inorganic material from the groove after the lapping can be omitted, and thereby one can obtain an excellent control of the thickness of the semiconductor layer and hence the device characteristics without decreasing the yield. By providing the lapping stopper in correspondence to the dicing lines in the wafer, the thickness of the semiconductor layer on the entire wafer is controlled uniformly.

Other objects and further features of the present invention will become apparent from the following detailed description of the present invention when read in conjunction with the attached drawings

DESCRIPTION OF THE PREFERRED EMBODIMENTS

Figure 4:
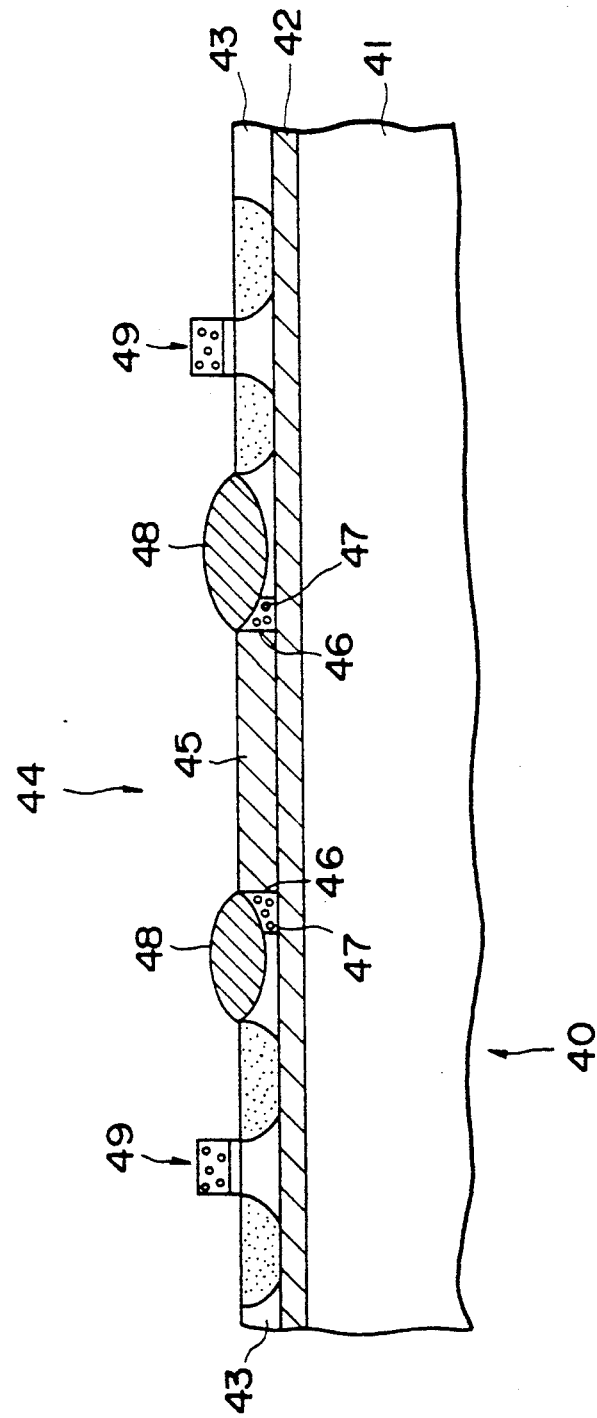
FIG. 4 is a cross-sectional view showing the structure of a first embodiment of a semiconductor device produced by a fabrication method of the present invention.

Hereinafter, a first embodiment of the present invention will be described with reference to FIG. 4 and FIGS. 5A-5D, wherein FIG. 4 shows a first embodiment of a device produced by a fabrication process of the present invention and FIGS. 5A-5D show the fabrication process thereof. The illustrated example is for the case where a SOI substrate is employed.

Referring to FIG. 4, the semiconductor device is constructed on a SOI substrate 40 comprising a substrate layer 41 of silicon carrying thereon an insulator layer 42 of silicon oxide. On the silicon oxide layer 42, there is provided a silicon active layer 43 on which various active devices 49 are formed. Thereby, the silicon substrate layer 41, the silicon oxide layer 42, and the silicon active layer 43 form the SOI substrate 40. The active layer 43 is formed with an opening (FIG. 5A) in correspondence to the dicing line, and a lapping stopper 45 is formed therein for resisting further lapping of the active layer 43. The lapping stopper 45 comprises a layer of material that has a hardness that exceeds the hardness of the active layer 43. For example, the lapping stopper 45 may comprise silicon oxide. The lapping stopper 45 is formed in the opening 44 with a separation from the side wall of the opening 44 as will be described, and there is formed a gap 46 between the lapping stopper 45 and the side wall of the opening 44. Further, the gap 46 is filled by an inorganic filling material 47 such as polysilicon. Further, there may be formed a field oxide region 48 between the lapping stopper 45 and the active device 49. As will be described later, it is preferable to provide the opening 44 as a groove coincident with the dicing lines on the silicon wafer. For this reason, the opening 44 will be referred to hereinafter as a groove. However, the opening 44 is by no means limited to grooves or dicing lines.

Next, the process of fabricating the semiconductor device of FIG. 4 will be described with reference to FIGS. 5A-5D. In the following description, only those parts that are essential for the present invention relating to the provision of the lapping stopper on the SOI substrate will be described.

First, a pair of single crystal silicon plates are prepared, and the surface thereof is subjected to oxidation. Further, the both silicon plates are contacted with each other intimately at the oxidized surface. By holding the structure thus formed in an oxidizing atmosphere at a temperature of 700° C. or more, there is formed a firm bonding between the two silicon plates. Thereby, a structure is formed wherein a silicon substrate 41 and a silicon plate or layer 43 are bonded with each other with an intervening silicon oxide layer 42. The silicon layer 43 may have an initial thickness of about 500 μm. The process for producing bonded silicon plates is described for example in J. B. Lasky et al. SILICON-ON-INSULATOR (SOI) BY BONDING AND ETCH-BACK, IEDM85, 28.4, pp. 684-687, which is explicitly incorporated herein by reference.

Figure 5A:
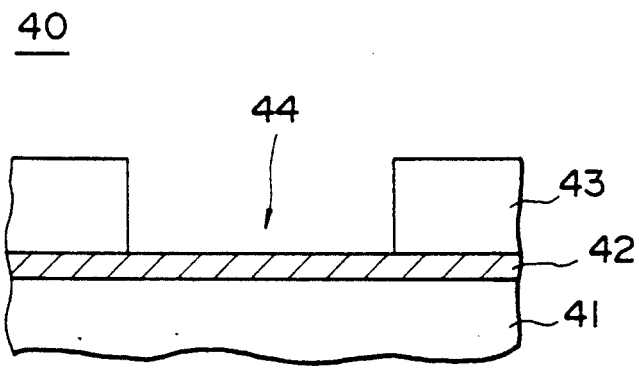
FIGS. 5A-5D are diagrams showing the process of fabricating the semiconductor device of FIG. 4.

Next, the silicon layer 43 is subjected to grinding and lapping process such that the thickness of the layer 43 is reduced to about 2 μm. Further, the layer 43 is subjected to a RIE process using a chloride etching gas such that an opening or groove 44 is formed as shown in FIG. 5A. Preferably, the etching process acts on the silicon layer 43 selectively while leaving the silicon oxide layer 42 substantially unetched. As long as the foregoing condition is satisfied, any etching process other than RIE such as isotropic etching, for example, may be employed. The isotropic etching is preferable from the view point that it leaves no unetched residue As a result of the etching, the top surface of the insulator layer 42 is exposed in correspondence to the groove 44.

Figure 5B:
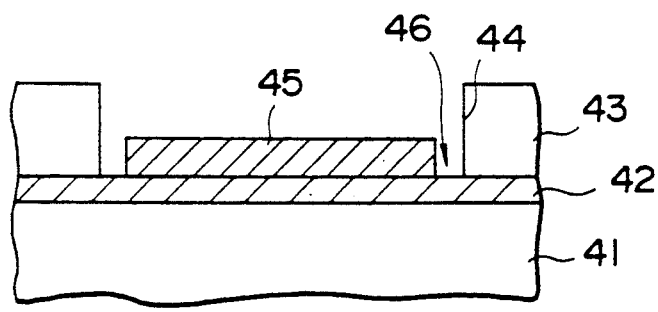

Next, a silicon oxide layer (not illustrated) is deposited on the entire surface of the silicon layer 43 including side walls and the bottom of the groove 44 wherein the silicon oxide layer 42 is exposed, for example by the CVD process, with a uniform thickness of 3000 Å for example, and the deposited silicon oxide layer is subsequently patterned by a RIE process employing a fluoride etching gas. Thereby, only a portion 45 of the silicon oxide layer is left in the groove 44 as shown in FIG. 5B. It should be noted that the portion 45 is provided directly on the exposed surface of the silicon oxide layer 42. This portion 45, being formed of silicon oxide, has a hardness that exceeds the hardness of the silicon layer 43 and acts as a lapping stopper that resists or prohibits lapping as will be described later. Upon the patterning, a gap 46 of about 0.1–1 μm is formed between the side wall of the lapping stopper 45 and the opposing side wall of the groove 44. This gap 46 is necessary to tolerate the deviation in alignment at the time of patterning as already explained with reference to the conventional structure.

Figure 5C:
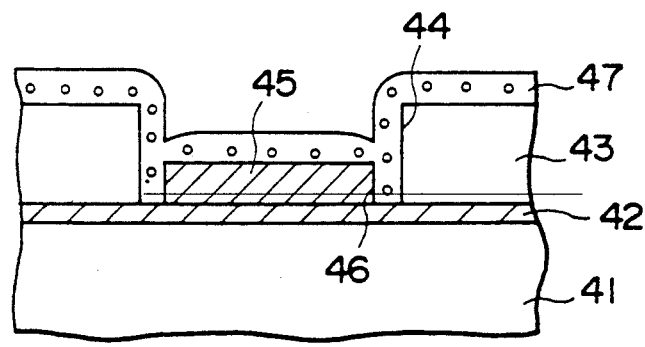

Next, polysilicon is deposited on the structure of FIG. 5B with a thickness of 1000 Å–2 μm to form a polysilicon layer 47 as shown in FIG. 5C. It should be noted that the polysilicon layer 47 fills the groove 44. As the polysilicon layer 47 comprises silicon, the layer 47 shows a lapping rate that is generally equal to the lapping rate of silicon active layer 43.

Figure 1A:
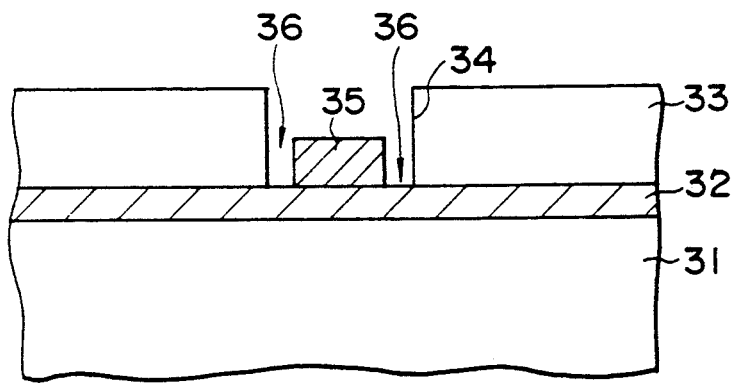
FIGS. 1A-1C are diagrams showing a conventional process of lapping a semiconductor layer provided on an insulator layer and the problem associated with the process.
Figure 1B:
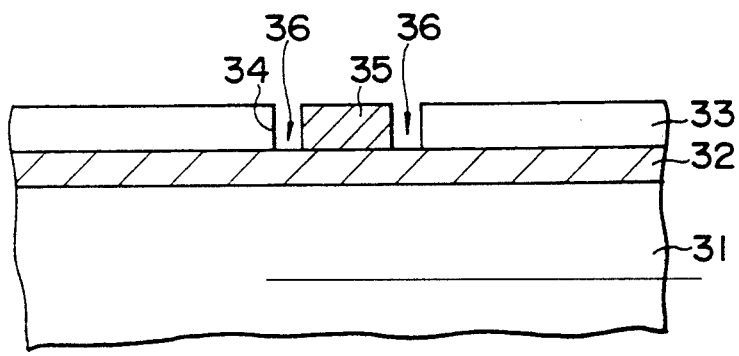
Figure 1C:
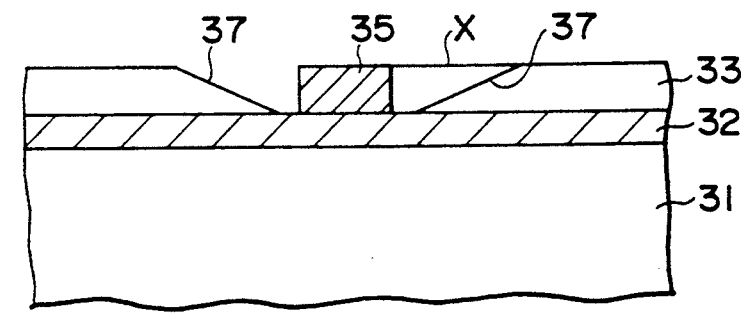
Figure 2A:
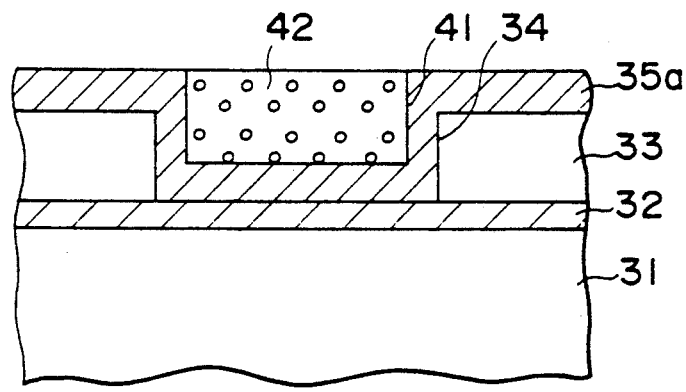
FIGS. 2A-2C are diagrams showing another conventional process of lapping a semiconductor layer provided on an insulator layer.
Figure 2B:
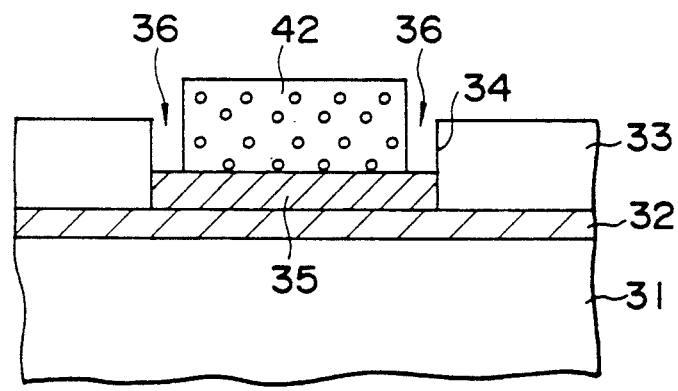
Figure 2C:
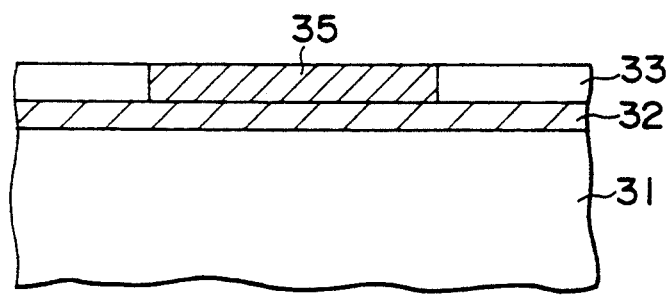
Figure 3A:
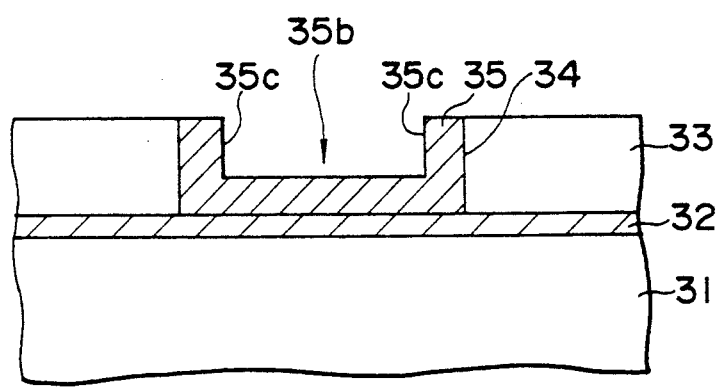
FIGS. 3A and 3B are diagrams showing the problem associated with the process of FIGS. 2A-2C.
Figure 3B:
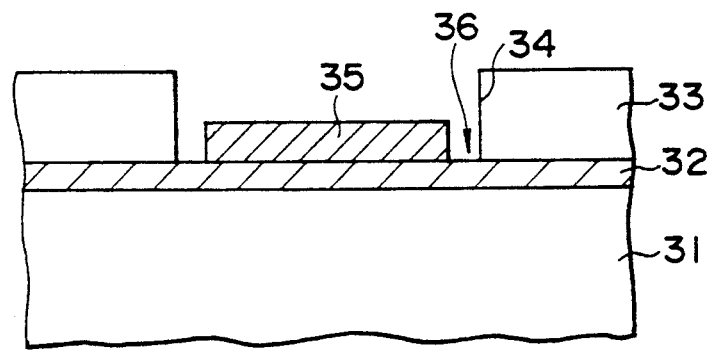
Figure 5D:
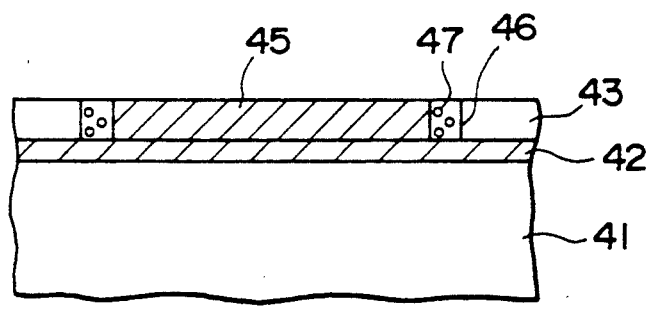

Further, the structure of FIG. 5C is subjected to lapping Thereby, the polysilicon layer 47 covering the silicon layer 43 is removed first, and subsequently the layer 43 until the surface of the lapping stopper 45 is exposed Once exposed, the lapping stopper 45, comprising silicon oxide, resists the lapping and thereby the lapping is substantially stopped In other words, there is formed a surface of the silicon active layer 43 that is substantially flush with the surface of the lapping stopper 45 as shown in FIG. 5D. As the gap 46 is filled by polysilicon 47 that has the hardness substantially identical with the hardness of the silicon active layer 43, the surface of the polysilicon 47 also becomes flush with the surface of the lapping stopper 45 and thereby an ideally planarized top surface is obtained on the structure of FIG. 5D. The problem of formation of declining surface around the lapping stopper 45, described with reference to FIG. 1C, is completely eliminated. By providing the etching stopper 45 in correspondence to the dicing lines on the wafer as will be described, one can control the thickness of the silicon active layer 43 exactly and uniformly over the entire surface of the silicon wafer.

After the step of FIG. 5D, the active layer 43 is formed with the field oxide region 48 to define the device region according to the well established process such as masking and oxidation in a wet oxygen atmosphere. Further, the active semiconductor device 49 such as a MOS transistor is formed on the active layer 43 according to the well known process In the foregoing process, it should be noted that the debris that are released as a result of the lapping is mainly of silicon. In other words, no organic material that may cause contamination of the semiconductor substrate is released as debris upon lapping as a result of use of the polysilicon as the layer 47. Further, the removal of the layer 47 filling the groove 46 is not necessary as compared to the case where a hard resin is used for filling the groove 46. It should be noted that, in the latter case, the resin has to be removed before proceeding to the process of forming active devices 49 on the silicon active layer 43. It should be noted further that the thickness of the silicon oxide lapping stopper 45 can be controlled exactly over entire surface of the wafer by the CVD process.

Next, a second embodiment of the present invention will be described with reference to FIG. 6 and FIGS. 7A–7D. In the drawings, those parts that corresponding to the parts described previously are given identical reference numerals and the description thereof will be omitted.

In this embodiment, there is provided a first polysilicon layer 47a in the groove 44 such that the polysilicon layer 47a covers the exposed insulator layer 42 and both side walls of the groove 44. On the polysilicon layer 47a, there is provided a silicon oxide layer as the lapping stopper 45 in correspondence to the groove 44 with a gap at both sides of the lapping stopper 45, and the gap 45 is filled completely by a second polysilicon layer 47b. Further, the usual field oxide region 48 is formed at both sides of the groove 44 and the active semiconductor devices 49 are formed in the region of the active layer 43 defined by the field oxide region 48. Similarly to the case of the first embodiment, it is preferred to provide the groove 44 in coincidence with the dicing line of the wafer.

Figure 6:
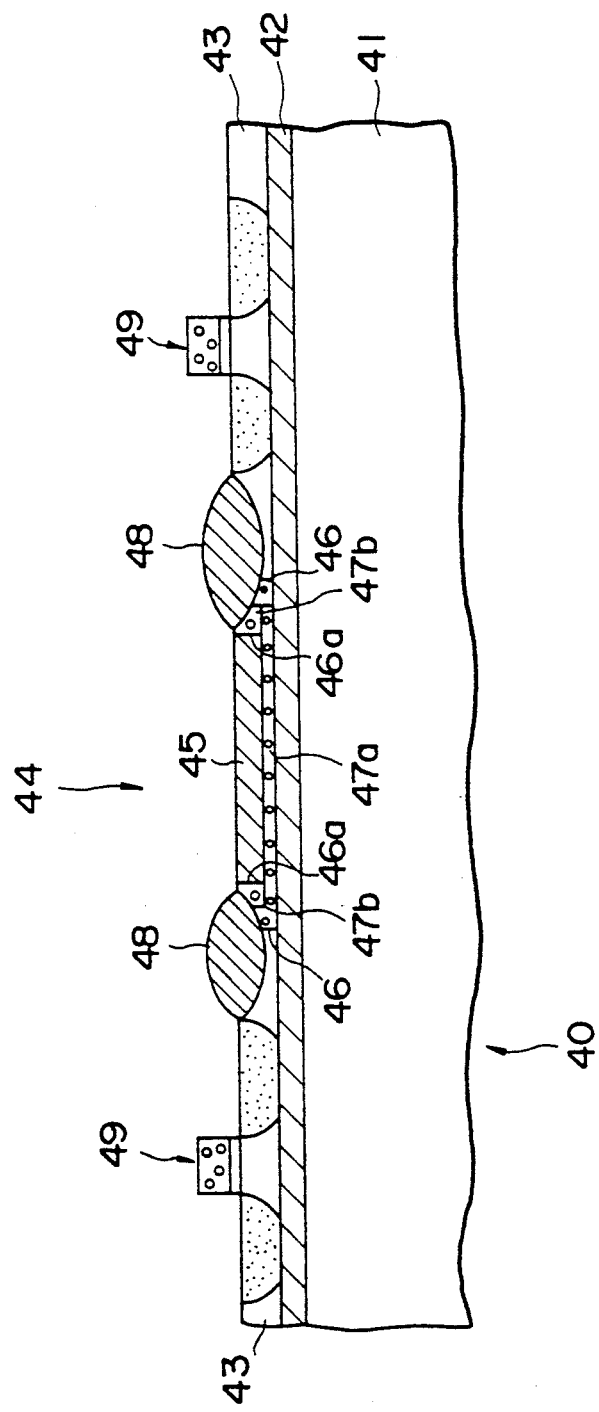
FIG. 6 is a cross-sectional view showing the structure of a second embodiment of the semiconductor device of the present invention.

Next, the process of fabricating the structure of FIG. 6 will be described with reference to FIGS. 7A–7D. Similarly to the case of the first embodiment, only the essential part relating to the formation of the lapping stopper will be described and the description for the usual process of forming semiconductor devices on the active semiconductor layer will be omitted.

Figure 7A:
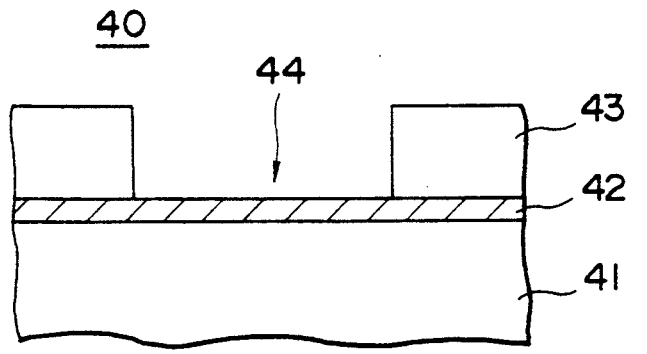
FIGS. 7A-7D are diagrams showing the process of fabricating the semiconductor device of FIG. 6.

Referring to FIG. 7A, there is formed a structure shown in FIG. 7A wherein the groove 44 is formed on the silicon active layer 43 that forms a part of the SOI substrate 40, similarly to the case of the first embodiment. The process for forming the SOI substrate 40 will be omitted.

Figure 7B:
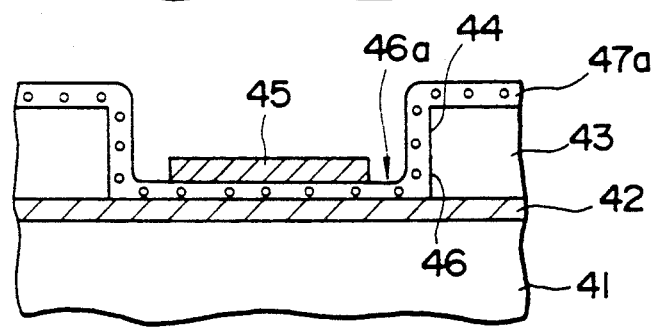

In a step of FIG. 7B, a polysilicon layer 47a is deposited uniformly with a thickness of about 1000 Å by the CVD process. As a result of the deposition, the polysilicon layer 47a covers the side walls of the silicon active layer 43 as well as the exposed top surface of the silicon oxide layer 42. Further, a silicon oxide layer (not shown) is deposited on the polysilicon layer 47a with a thickness of about 2000 Å by the CVD process including the groove 44. Next, the deposited silicon oxide layer is patterned by the RIE process employing a fluoride etching gas such that the silicon oxide layer is selectively removed, leaving the lapping stopper structure 45 on the polysilicon layer 47a in correspondence to the groove 44. As a result of the patterning, there is formed a gap 46a at both sides of the lapping stopper 45, separating the latter laterally from the polysilicon layer 47a covering the side wall of the groove 44.

Figure 7C:
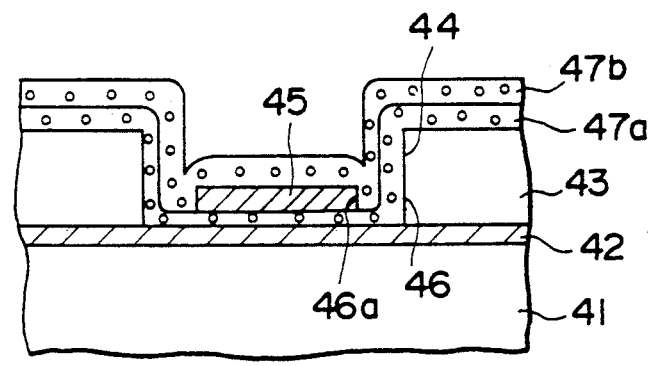
Figure 7D:
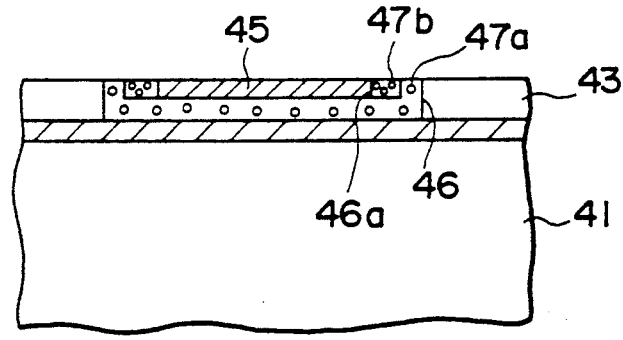

Next, another polysilicon layer 47b is deposited on the structure of FIG. 7B including the groove 44 with a thickness of about 1000 Å–2 μm as shown in FIG. 7C such that the lapping stopper 45 is buried under the polysilicon layer 47b. Further, in a step of FIG. 7D, the structure of FIG. 7C is lapped, starting from the surface of the polysilicon layer 47b until the top surface of the lapping stopper 45 is exposed as shown in FIG. 7D. Once this occurs, further lapping is resisted by the lapping stopper 45 and the layer thickness of the active layer 43 is determined by the level of the surface of the lapping stopper 45.

As both sides of the lapping stopper 45 are filled completely by the polysilicon layers 47a and 47b, the lapped surface of the structure of FIG. 7D remains completely flat including the region corresponding to the groove 44. Thereby, the advantageous feature of the first embodiment, including the elimination of the declining surface region around the lapping stopper 45, the elimination of the contamination of the SOI substrate by the debris of material filling the gap between the lapping stopper 45 and the side wall of the groove 44, the elimination of the need for removing the material filling the gap before the subsequent processes for constructing active semiconductor devices and the like, are obtained. In addition, one can control the etching process of FIG. 7B for forming the lapping stopper 45 exactly such that the etching is stopped by the polysilicon layer 47a immediately and automatically when the silicon oxide layer corresponding to the groove 46a is removed and the polysilicon layer 47a is exposed at the groove 46a. This is an improvement over the first embodiment wherein the etching for forming the lapping stopper 45 has to be controlled externally by the intervention of the operator upon exposure of the silicon oxide layer 42 at the groove 46. It should be noted further that the formation of the silicon oxide layer that provides the lapping stopper 45 is not limited to the CVD process but may be a thermal oxidation process of the polysilicon layer 47a. In this case, a dense, hard silicon oxide layer is formed as the lapping stopper 45.

After the step of FIG. 7D, the field oxide region 48 is formed as usual and the semiconductor devices 49 such as MOS transistors or bipolar transistors are formed on the silicon active layer 43 according to the well established process. Thereby, the structure of FIG. 6 is obtained.

Next, a third embodiment of the present invention will be described with reference to FIG. 8 and FIGS. 9A–9D. In the drawings, those parts that have already been described are given identical reference numerals as before and the description thereof will be omitted.

Figure 8:
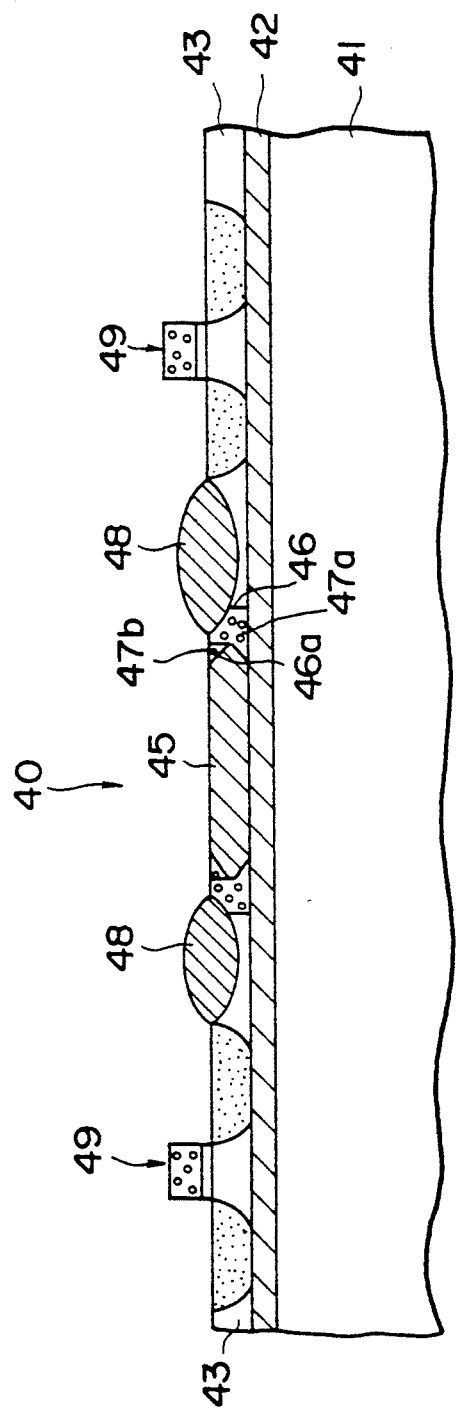
FIG. 8 is a cross-sectional view showing the structure of a third embodiment of the semiconductor device produced by a fabrication method of the present invention.

Referring to FIG. 8, the third embodiment device has the lapping stopper 45 of silicon oxide that is provided directly on the silicon oxide layer 42. Further, the gaps 46 at both sides of the lapping stopper are filled by a first layer of polysilicon and a second layer of polysilicon as will be described below. As the rest of the feature of the device of FIG. 8 is identical with that of the previously described device, further description of the device will be omitted.

Next, the process for forming the device will be described.

Figure 9A:
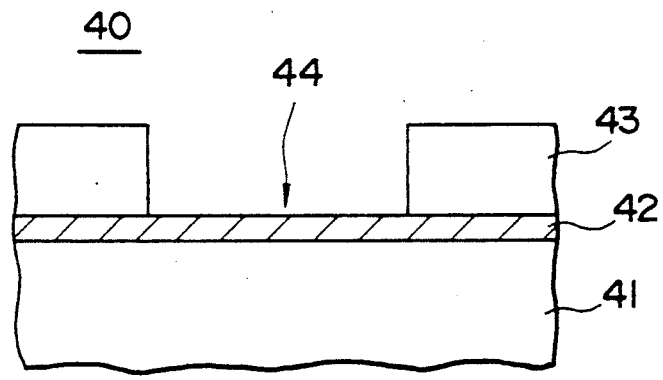
FIGS. 9A-9D are diagrams showing the process of fabricating the semiconductor device of FIG. 8.

Referring to FIG. 9A, the groove 44 is formed on the silicon active layer 43 on the SOI substrate 40 as already described with reference to the first and second embodiments.

Next, a polysilicon layer 47a' is deposited uniformly on the structure of FIG. 9A with a thickness of about 1500 Å by the CVD process, such that the exposed surface of the silicon oxide layer 42 and the side walls of the groove 44 are covered by the polysilicon layer 47a'. Further, a silicon nitride layer 51 acting as an anti-oxidation mask is provided on the polysilicon layer 47a' by the CVD process. The silicon nitride layer 51 is patterned subsequently by a conventional photolithography and RIE process using a fluoride etching gas, and thereby a window exposing the polysilicon layer 47a' in correspondence to the bottom of the groove 44 is formed. Further, the structure having the window thus formed in the silicon nitride layer 51 is subjected to a thermal oxidation process. Thereby, the exposed part of the polysilicon layer 47a' is oxidized and there is formed a silicon oxide body acting as the lapping stopper 45 as shown in FIG. 9B in correspondence to the window formed in the silicon nitride layer 51.

Figure 9B:
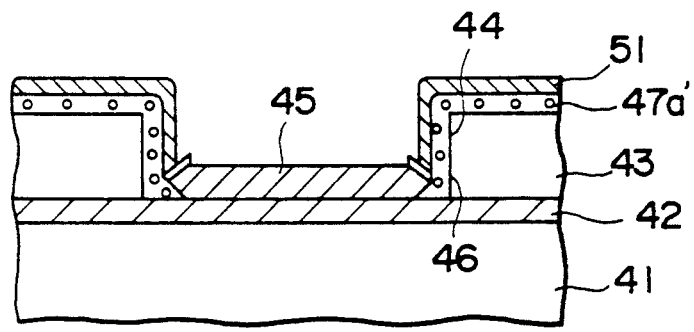
Figure 9C:
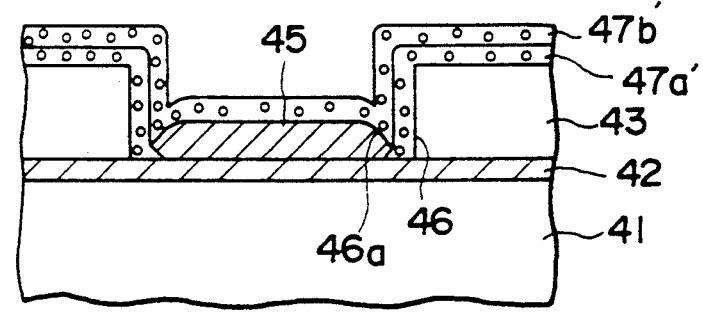
Figure 9D:
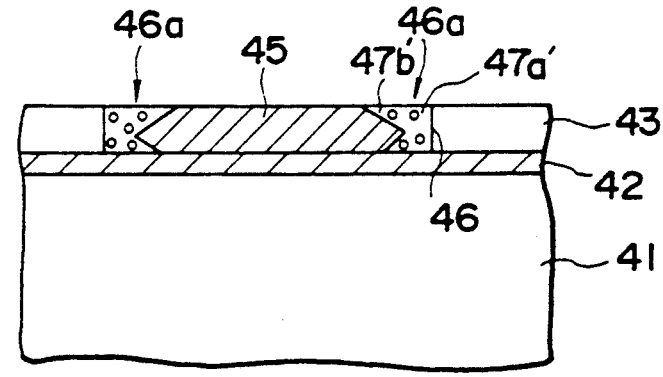

After the step of FIG. 9B, the silicon nitride layer 51 is removed by a wet etching process and a second polysilicon layer 47b' is deposited by the CVD process with a thickness of about 1000 Å–2 μm as shown in FIG. 9C. Next, the structure of FIG. 9C is subjected to lapping starting from the top surface of the polysilicon layer 47b'. Thereby, the polysilicon layers 47b', 47a' and the silicon layer 43 are lapped until the top surface of the lapping stopper 45 is exposed as shown in FIG. 9D. By the present embodiment, too, the gap 46a formed at both sides of the lapping stopper 45 is filled completely by the polysilicon layers 47a' and 47b; and thereby a completely flat surface is obtained on the structure of FIG. 9D.

After the step of FIG. 9D, the field oxide region 48 and the active semiconductor device 49 are formed as usual and the semiconductor device of FIG. 8 is obtained.

According to the present embodiment, the thickness of the lapping stopper 45 and hence the thickness of the active layer 43 is controlled by the thermal oxidation process of the polysilicon layer 47a'. The lapping stopper 45 thus formed in the present invention has a preferable feature of dense structure and increased hardness.

Figure 10A:
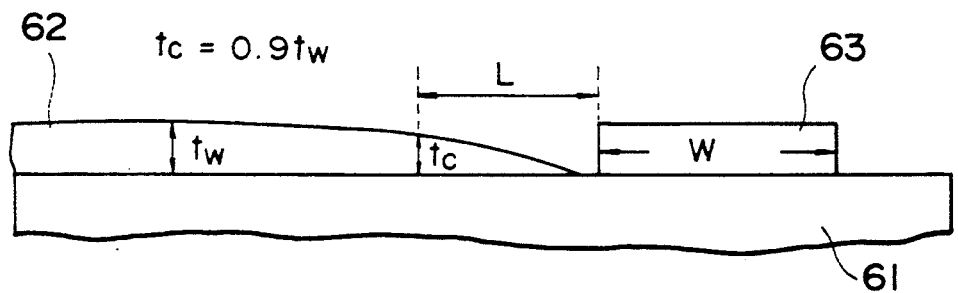
FIG. 10A is a diagram showing definition of parameters characterizing the morphology of the semiconductor device.
Figure 10B:
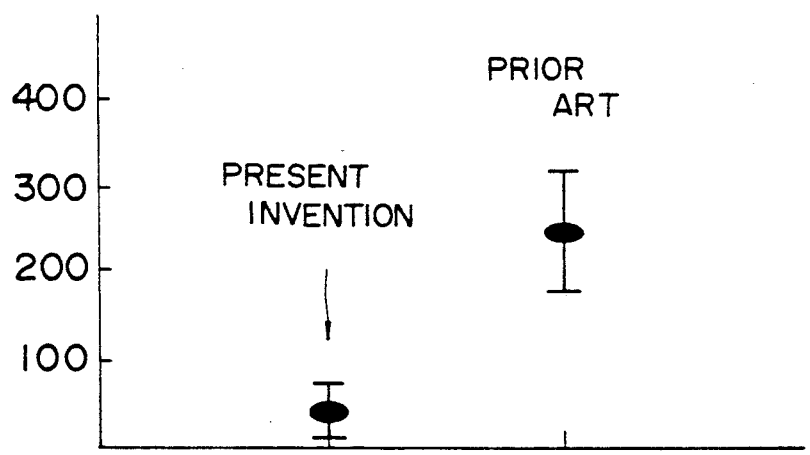
FIG. 10B is a diagram showing the effectiveness of the present invention in comparison with the effectiveness of the conventional structure of FIG. 1C.

FIGS. 10A and 10B show the result of experiments conducted on the SOI substrate of the first embodiment to confirm the effect of invention, wherein FIG. 10A defines the parameters and FIG. 10B shows the effect of the invention. In the present experiment, a single crystal silicon layer 62 provided on a silicon oxide layer 61 was subjected to the lapping wherein the thickness of the layer 62 was decreased from the initial value of 3.0 μm to the target value of 0.3 μm, using the silicon oxide lapping stopper 63 provided on the silicon oxide layer 61 with a width W of 100 μm. The lapping was made using a polyurethane cloth wrapped on a rotary disk, while pressing the sample on the cloth with a pressure of 100–500 g/cm2. Ceramic abrasives having the grain size of 0.01 μm were used. Thereby, a lapping rate of 10–50 μm/hour was obtained for the silicon layer 62. On the other hand, the lapping rate for the silicon oxide was smaller than that for silicon by a factor of about 200 or more. In the experiment, the length L of the declining region adjacent to the structure 63 is measured for a specimen that has the structure of FIG. 5D wherein the gap 46 is filled by the polysilicon and another specimen that has the structure of FIG. 1B wherein the gap 46 is left unfilled. As defined in FIG. 10A, the length L is defined as a distance from the side wall of the lapping stopper 63 to a point on the declining region of the semiconductor layer 62 that is characterized by a thickness to that satisfies a relation tc=0.9 tw, where tw is the thickness of the layer 62.

As will be seen clearly from FIG. 10B, the length L is smaller than 100 μm in the specimen that has the structure pertinent to the present invention, while the specimen of the conventional structure shows the distance L of 200-300 μm. In other words, the present invention is extremely useful for getting a planarized surface on the lapped semiconductor layer.

Figure 11A:
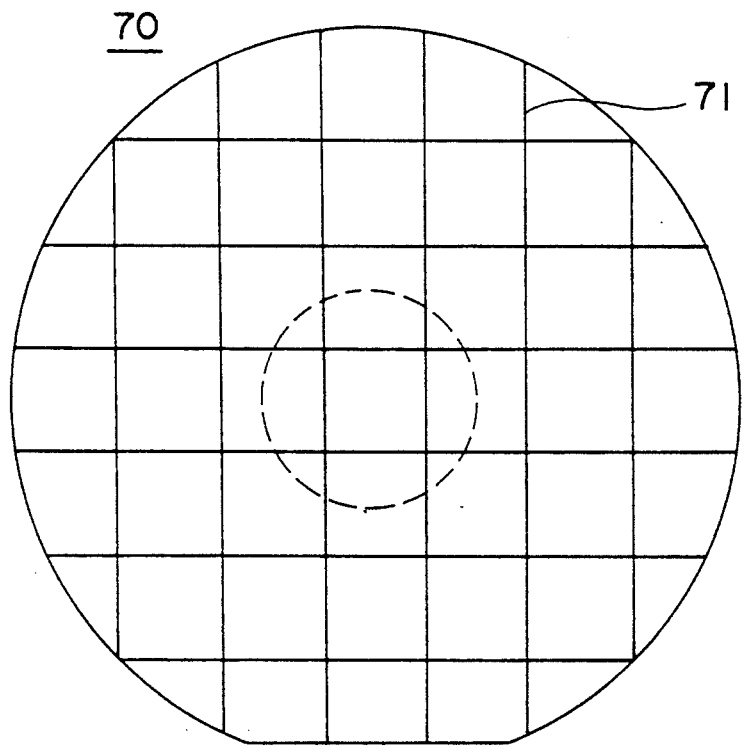
FIG. 11A is a plan view showing the wafer in which the semiconductor device produced by a fabrication method of the present invention is formed.
Figure 11B:
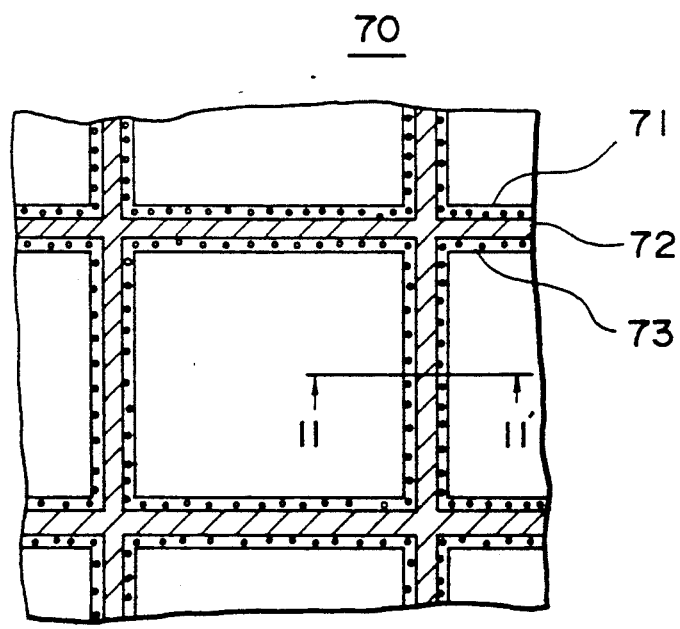
FIG. 11B is a plan view showing a part of FIG. 11A in an enlarged scale.

FIG. 11A is a plan view of a silicon wafer 70 on which the SOI substrate of either of the first through third embodiments of the present invention is formed. As will be seen from FIG. 11A, the wafer 70 is divided into a number of rectangular chip regions by dicing lines 71. In each dicing line 71, there is formed a groove corresponding to the groove 44 as shown in an enlarged plan view of FIG. 11B, and there is provided a silicon oxide lapping stopper 72 corresponding to the etching stopper 45, and the space or groove formed between the lapping stopper 72 and the side wall of the groove 44 is filled by a polysilicon layer 73 corresponding to the polysilicon layer 47.

Figure 12:
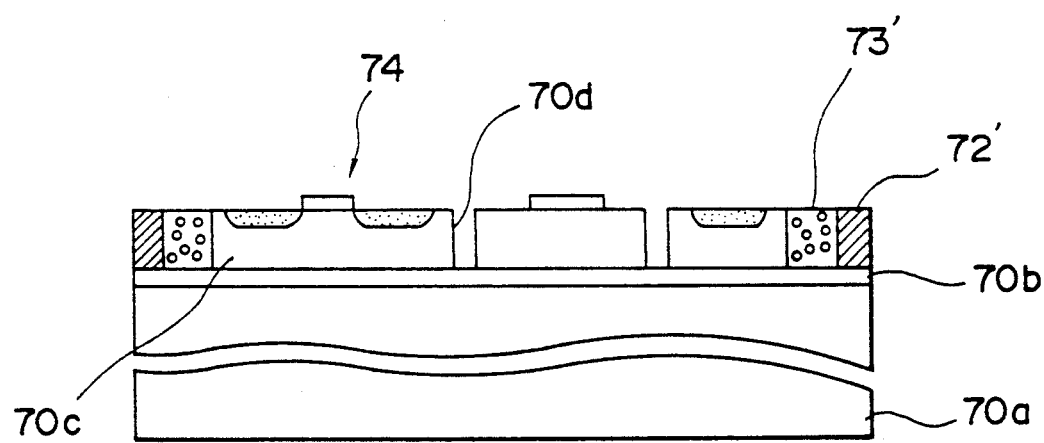
FIG. 12 is a cross-sectional view schematically showing the feature of the semiconductor device that is formed by the methods of the present invention after dicing along the dicing line.

After formation of the active devices and interconnections on the wafer 70, the wafer 70 is cut along the dicing lines 71 and a semiconductor device having a cross-section shown in FIG. 12 is obtained. The semiconductor device comprises one or more active devices 74 constructed on a silicon active layer 70c provided on a silicon oxide layer 70b. The layer 70b in turn is provided on a silicon layer 70c that formed a part of the silicon wafer 70 before the dicing. The active layer 73 may be divided into a number of isolated device regions by an isolation groove 70d. The semiconductor device or chip thus obtained is characterized by the silicon oxide region 72' that formed a part of the lapping stopper 72 before the dicing and the polysilicon region 73' that formed a part of the polysilicon layer 73 at one or both sides of the chip.

Further, the present invention is not limited to the embodiments described heretofore, but various variations and modifications may be made without departing from the scope of the invention.

What is claimed is:

1. A method for producing a semiconductor device on a semiconductor layer provided on a top surface of an insulator layer, comprising the steps of:
   providing an opening defined by a side wall on the semiconductor layer to expose a top surface of the insulator layer;
   depositing a first material layer of a first inorganic material that has a hardness exceeding a hardness of the semiconductor layer on the semiconductor layer including the exposed top surface of the insulator layer;
   patterning the first material layer such that a patterned region of the first inorganic material is left in the opening, said patterned region being defined by a side wall such that the side wall of the region is separated from the side wall of the semiconductor layer by a gap;
   depositing a second material layer of a second inorganic material having a hardness substantially equal to the hardness of the semiconductor layer such that the second material layer covers the semiconductor layer including the opening wherein the patterned region of the first inorganic material is formed, said second material layer being deposited such that the second material layer covers the side wall of the opening and fills the gap between the side wall of the patterned region and the side wall of the opening; and
   lapping a top surface of the semiconductor layer that is covered by the second material layer, starting from a top surface of the second material layer and proceeding toward the insulator layer until a top surface of the patterned region of the first inorganic material is exposed.

2. A method as claimed in claim 1, wherein said step of depositing the first material layer comprises a chemical vapor deposition process for depositing silicon oxide as the first inorganic material.

3. A method as claimed in claim 1, wherein said step of depositing the second material layer comprises a chemical vapor deposition process for depositing polysilicon as the second inorganic material.

4. A method as claimed in claim 1, wherein said second inorganic material comprises an inorganic material which causes substantially no contamination of the semiconductor layer that is material to characteristics of the semiconductor device when the second material layer is subjected to the lapping and debris from the second material layer are formed in response to the lapping.

5. A method for producing a semiconductor device on a semiconductor layer provided on a top surface of an insulator layer, comprising the steps of:
   providing an opening defined by a side wall on the semiconductor layer to expose a top surface of the insulator layer at a bottom part of the opening;
   depositing a first material layer of a first inorganic material that has a hardness substantially identical with a hardness of the semiconductor layer, said first material layer being deposited so as to cover at least the exposed top surface of the insulator layer and the side wall of the opening;
   depositing a second material layer of a second inorganic material that has a hardness exceeding the hardness of the semiconductor layer such that the second material layer at least covers a bottom part of the first material layer that covers the exposed top surface of the insulator layer;
   patterning the second material layer such that a patterned region of the second inorganic material defined by a side wall is left on the bottom part of the first material layer such that the side wall of the patterned region is separated from a part of the first material layer that covers the side wall of the opening by a gap;
   depositing a third material layer of a third inorganic material having a hardness that is substantially identical with the hardness of the semiconductor layer, such that the third material layer at least buries the patterned region of the second inorganic material and such that the third material layer covers a part of the first material that covers the side wall of the opening, said step of depositing the third material layer being made such that the gap is filled by the third material layer; and
   lapping a top surface of the semiconductor layer on which the first and third material layers are deposited, starting from a top surface of the third material layer and proceeding toward the insulator layer until a top surface of the patterned region is exposed.

6. A method as claimed in claim 5, wherein each of said steps of depositing the first and second material layers comprises a chemical vapor deposition process of polysilicon.

7. A method as claimed in claim 5, wherein said step of depositing the second material layer comprises a chemical vapor deposition process of silicon oxide.

8. A method as claimed in claim 5,
wherein each of said first through third inorganic materials comprises a material, and
wherein debris from the material causes no contamination of the semiconductor layer that is material to characteristics of the semiconductor device.

9. A method for producing a semiconductor device on a semiconductor layer provided on a top surface of an insulator layer, comprising the steps of:
providing an opening defined by a side wall on the semiconductor layer to expose a top surface of the insulator layer;
depositing a first material layer of a first inorganic material that has a hardness substantially identical with a hardness of the semiconductor layer, said first material layer being deposited to cover a top surface of the semiconductor layer including the exposed top surface of the insulator layer and the side wall of the opening;
depositing a masking layer of a material that resists oxidation upon heat treatment in an oxidizing atmosphere such that the masking layer covers the first material layer at least in correspondence to a part of the first material layer that covers the exposed top surface of the insulator layer;
patterning the masking layer such that a part of the top surface of the insulator layer that is covered by the first material layer at a bottom of the opening is exposed;
oxidizing the exposed part of the insulator layer exposed by the patterned masking layer at the bottom of the opening, to form an oxide region in correspondence to the exposed part;
removing the masking layer;
depositing a second material layer of a second inorganic material having a hardness that is substantially identical with the hardness of the semiconductor layer, such that the second material layer at least covers the opening continuously including the oxide region at the bottom of the opening and the side wall of the opening; and
lapping a top surface of the semiconductor layer on which the first and second material layers are deposited, starting from a top surface of the second material layer and proceeding toward the insulator layer until a top surface of the oxide region is exposed.

10. A method as claimed in claim 9, wherein said step of depositing the masking layer comprises a chemical vapor deposition process of silicon nitride.

11. A method as claimed in claim 9, wherein said step of removing the masking layer comprises an etching process which uses a wet etching process.

12. A method for producing a semiconductor layer provided on a top surface of an insulator layer, the semiconductor layer having a first surface, comprising the steps of:
forming a second surface which is comparatively lower than the first surface;
forming a region of a first material layer over the second surface, said first material layer being of a first inorganic material which has a hardness exceeding a hardness of the semiconductor layer;
filling a gap between a side wall of the region and a side wall between the first and second surfaces with a second material layer of a second inorganic material having a hardness less than the hardness of the first material layer; and
lapping the first surface of the semiconductor layer until said lapping is impeded by the region so that the first surface of the semiconductor layer is substantially flush with a top surface of the region.

13. A method as claimed in claim 12,
wherein the second material layer includes a first filling layer and a second filling layer, and
wherein said step of filling the gap includes the substeps of:
filling a first portion of the gap with the first filling layer, and
filling a second portion of the gap with the second filling layer.

* * * * *

UNITED STATES PATENT AND TRADEMARK OFFICE
CERTIFICATE OF CORRECTION

PATENT NO. : 5,162,254
DATED : November 10, 1992
INVENTOR(S) : Shouji USUI et al.

It is certified that error appears in the above-identified patent and that said Letters Patent is hereby corrected as shown below:

Column 1, line 26, after "another"

delete --,-- (comma);

Column 1, line 65, change "signal"

to --sianol--;

Column 2, line 55, change "21A" to --1A--;

Column 2, line 61, change "in" to --ion--.

UNITED STATES PATENT AND TRADEMARK OFFICE
CERTIFICATE OF CORRECTION

PATENT NO. : 5,162,254  Page 2 of 4
DATED : November 10, 1992
INVENTOR(S) : Shouji USUI et al.

It is certified that error appears in the above-identified patent and that said Letters Patent is hereby corrected as shown below:

Column 4, line 18, after "lapping"

insert --.-- (a period).

Column 5, line 43, after "device" insert

--produced by a fabrication method--;

Column 6, line 47, delete "both".

Column 7, line 4, after "residue" insert

--.-- (a period);

UNITED STATES PATENT AND TRADEMARK OFFICE
CERTIFICATE OF CORRECTION

PATENT NO. : 5,162,254
DATED : November 10, 1992
INVENTOR(S) : Shouji USUI et al.

It is certified that error appears in the above-identified patent and that said Letters Patent is hereby corrected as shown below:

Column 7, line 37, after "lapping"

insert --.-- (a period).

Column 7, line 40, after "exposed"

insert --.-- (a period).

Column 7, line 42, after "stopped"

insert --.-- (a period);

Column 7, line 52, change "face"

to --faces--;

Column 7, line 65, after "process"

insert --.-- (a period).

UNITED STATES PATENT AND TRADEMARK OFFICE
CERTIFICATE OF CORRECTION

PATENT NO. : 5,162,254

DATED : November 10, 1992

INVENTOR(S) : Shouji USUI et al

It is certified that error appears in the above-indentified patent and that said Letters Patent is hereby corrected as shown below:

Column 10, line 65, change "to"
 to --tc--.

Signed and Sealed this

Twenty-second Day of February, 1994

Attest:

BRUCE LEHMAN

Attesting Officer          Commissioner of Patents and Trademarks